(12) United States Patent
Kelkar et al.

(10) Patent No.: US 6,932,136 B1
(45) Date of Patent: Aug. 23, 2005

(54) POST SINGULATION DIE SEPARATION APPARATUS AND METHOD FOR BULK FEEDING OPERATION

(75) Inventors: Nikhil Kelkar, San Jose, CA (US); Ken Pham, San Jose, CA (US); Jaime A. Bayan, Palo Alto, CA (US); Cheol Hyun Han, Fremont, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/821,824

(22) Filed: Apr. 8, 2004

(51) Int. Cl.[7] ............................................. B32B 35/00
(52) U.S. Cl. ........................ 156/584; 156/344; 438/464
(58) Field of Search ............................. 156/344, 584; 438/464, 976

(56) References Cited

U.S. PATENT DOCUMENTS

| | | | |
|---|---|---|---|
| 4,798,645 A * | 1/1989 | Pak | 156/344 |
| 5,399,228 A * | 3/1995 | Schroeder et al. | 156/542 |
| 5,482,899 A * | 1/1996 | McKenna et al. | 156/344 |
| 6,364,089 B1 | 4/2002 | Singh et al. | |
| 2003/0071051 A1 * | 4/2003 | Martinsen | 221/70 |

FOREIGN PATENT DOCUMENTS

JP 52-27352 * 3/1977 ................. 156/584

* cited by examiner

*Primary Examiner*—Mark A. Osele
(74) *Attorney, Agent, or Firm*—Beyer Weaver & Thomas

(57) ABSTRACT

A post singulation, die separation assembly for bulk separation of a plurality of dice in a singulated wafer from the adhesive backing of wafer saw tape. The die separation assembly includes a support base having a support surface, a first portion and an opposite second portion thereof. The second portion includes a down-ramped portion thereof skewed downwardly at a first acute angle from the support surface. A feed tray includes a collection end positioned adjacent the base second portion such that an elongated, substantially thin gap is formed between the tray collection end and at least a portion of the base second portion. A flexible platform is movably supported atop the base support surface for movement from the first portion to the second portion thereof. At the second portion, the platform passes downward through the gap formed between the tray collection end and the at least a portion of the base second portion. The platform defines an upward facing surface upon each die of the singulated wafer is adhered thereto, via the saw tape, in a forward aligned manner. Upon movement of the flexible platform down the down-ramped portion of the support base, a portion of the wafer saw tape thereat is peeled away from the respective die. The tape is the separated from the dice, releasing the respective dice onto the collection end of the feed tray in a manner substantially maintaining their forward alignment orientation of thereof.

20 Claims, 5 Drawing Sheets

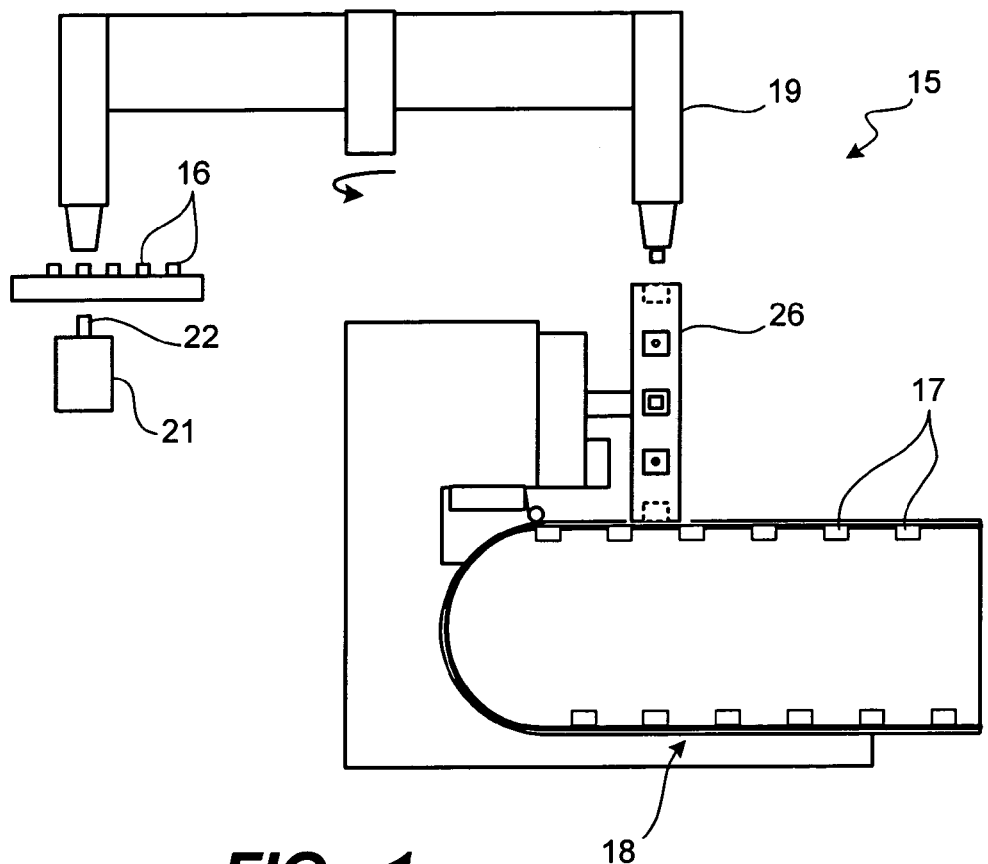
FIG._1
(PRIOR ART)
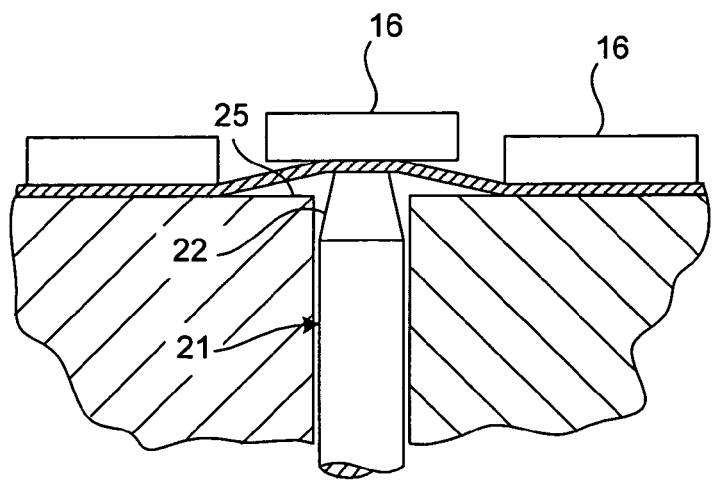
FIG._2
(PRIOR ART)

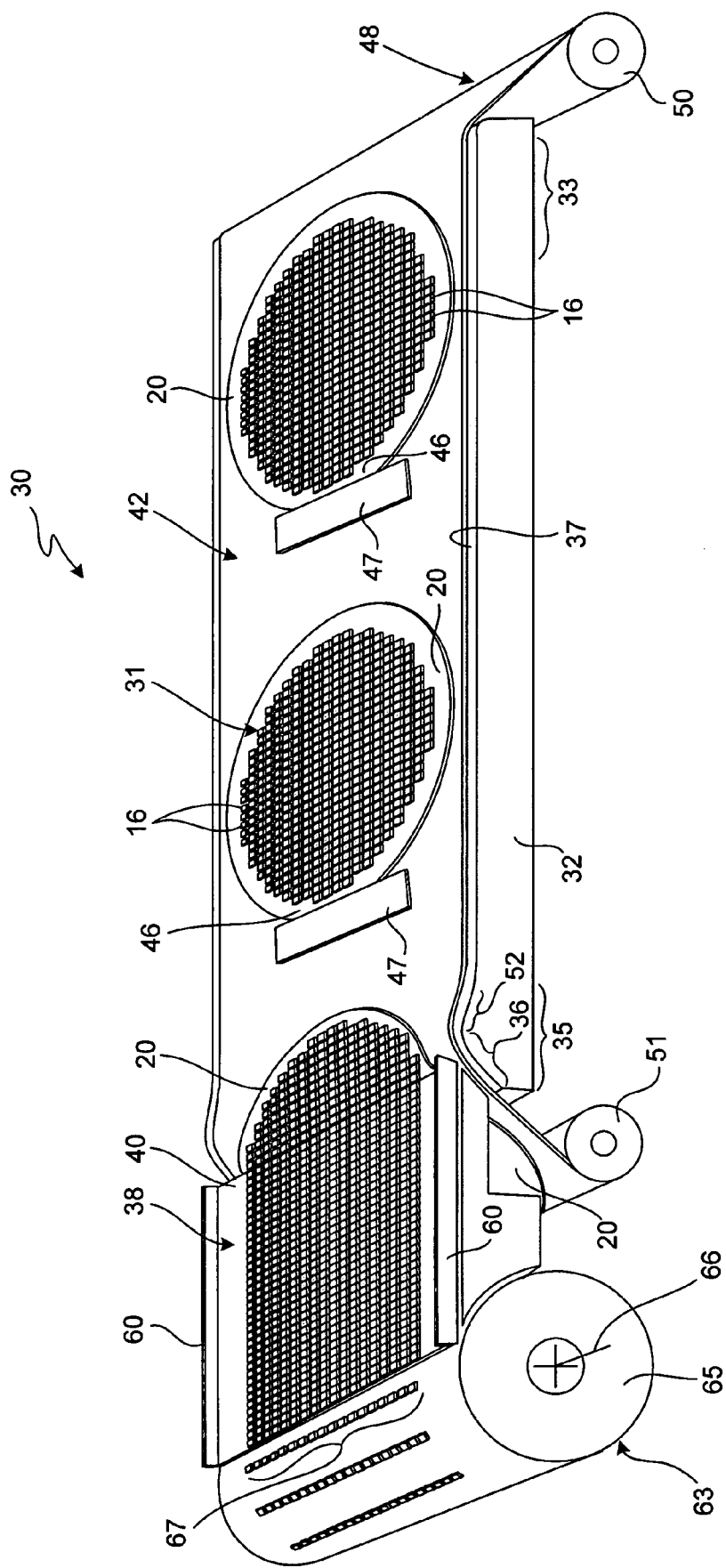
FIG._3

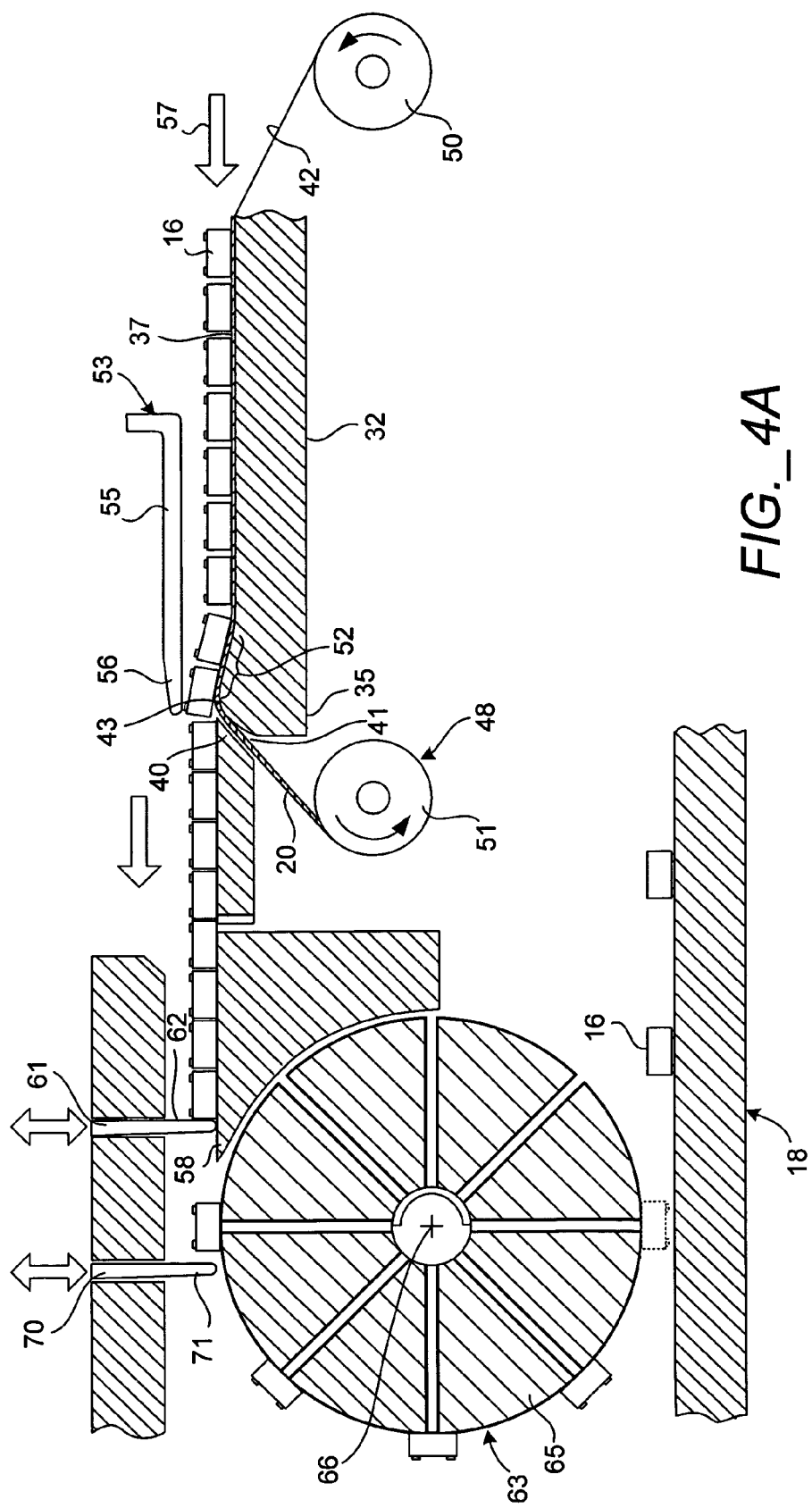
FIG._4A

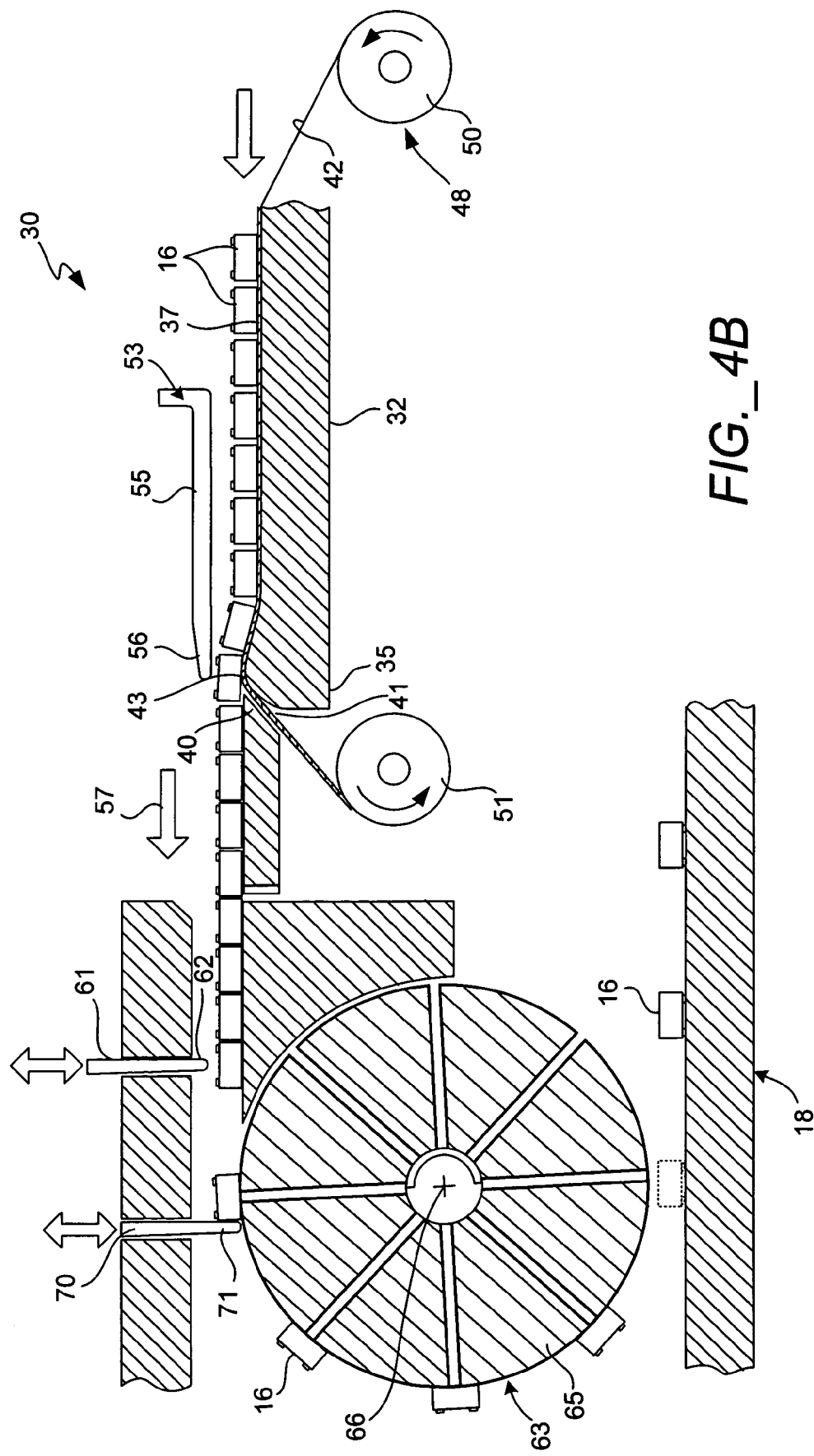
FIG._4B

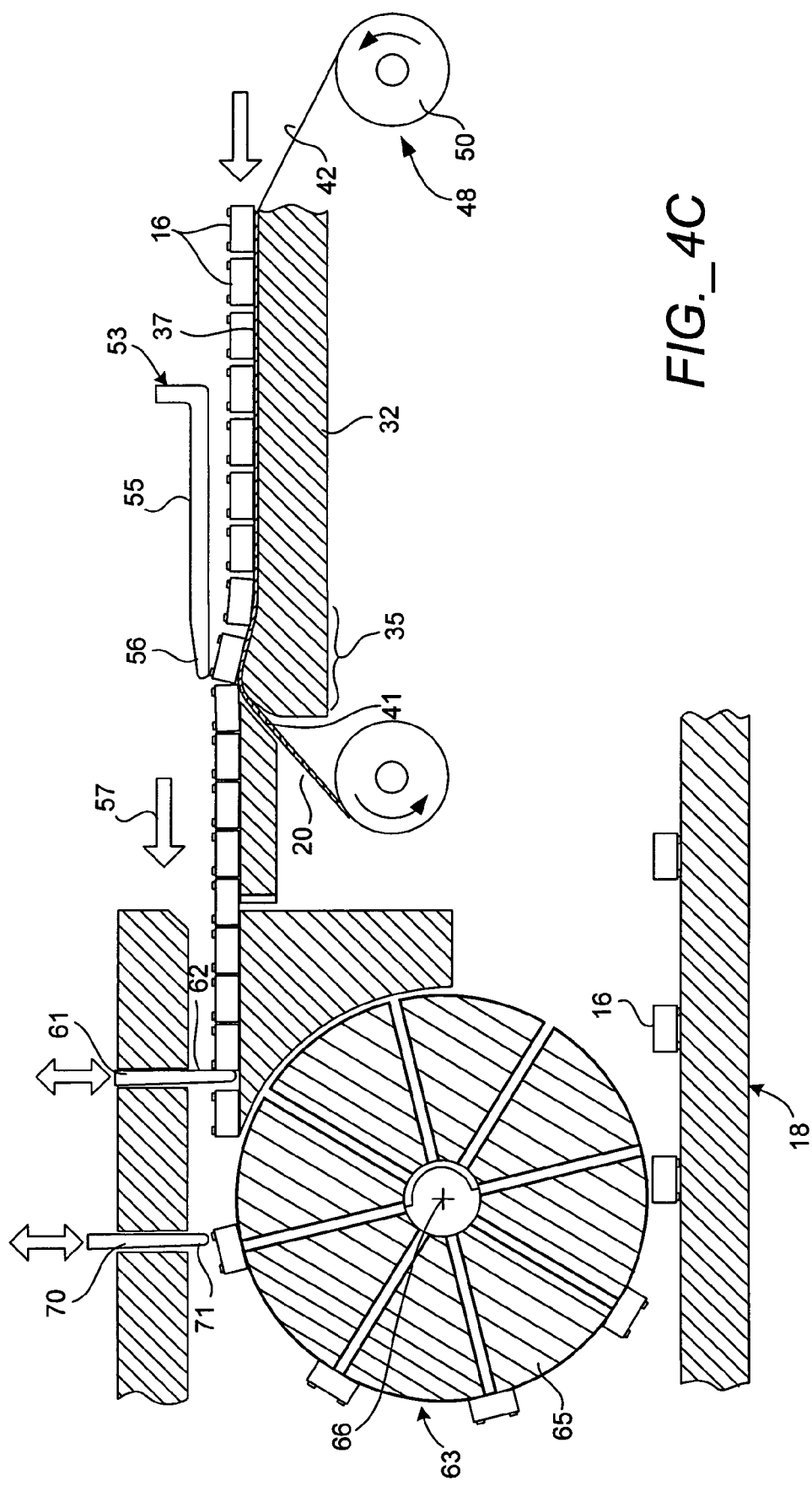

POST SINGULATION DIE SEPARATION APPARATUS AND METHOD FOR BULK FEEDING OPERATION

BACKGROUND OF THE INVENTION

1. Field of the Invention

The present invention relates generally to post die singulation of wafers, and more particularly, relates to separation of dice from wafer saw tape while substantially retaining the orientation die during separation.

2. Description of the Related Art

Semiconductor Integrated Circuits (ICs) are typically fabricated in wafer form on wafer saw tape. After fabrication, using precision cutting techniques, individual die are cut or singulated from the wafer without cutting through the saw tape. In the past, where the precise orientation of the die was necessary, a tape and reel assembly was typically applied to transport the chips to the individual processing stations. The tape and reel assembly includes a tape with a plurality of transport cavities spaced at regular intervals. Once a chip has been placed inside a transport cavity, the cavity is sealed with an adhesive tape so the chip can be safely transported from station to station by the tape and reel assembly. However, to transfer chips singulated from a wafer into the cavities of the tape and reel assembly, special devices, known as device transfer machines were used.

As shown in FIG. 1, these special transfer machines 15 are responsible for transferring and flipping a semiconductor device, such as a flip chip die 16, from a singulated wafer to a transport cavity 17 which is part of the tape and reel assembly 18. The transfer to the transport cavity 17 is complicated by the small size, delicacy and orientation of the die 16. An exemplary flip chip die may be about 35 mils square, which limits the applicable handling techniques. In addition, after singulation, the die is precisely oriented with its solder bumps facing up. However, in order to mount the die, it has to be placed in the transport cavity with the solder bumps facing downward.

Typically, the transfer machine 15 includes a robotic loading arm or another suitable pick and place mechanism 19 that precisely picks and places the die 16 from the wafer saw tape 20. The loading arm 19 usually includes a head housing a vacuum tube that applies a vacuum pressure on the support surface of the die between the solder bumps to transport the die from the saw tape 20 to the transport cavity 17. To dislodge the die from the adhesive of the wafer saw tape 20, however, the vacuum tube approach alone is usually insufficient.

One technique and apparatus applied to separate the adhered die from the saw tape 20 is to apply a needle push-up system 21 with vacuum assistance to facilitate retention of the wafer saw tape during the push-up procedure. As shown in FIG. 2, when a selected die 16 is properly positioned over the push-up system 21, a push-up needle 22 thereof moves the die 16 upwardly and partially separates the die from the wafer saw tape 20 from underneath. When the push-up needle 22 begins pushing the single die 16 upward from below, the vacuum assistance commences to retain the saw tape 20 surrounding the die against the support surface 25. The saw tape 20 is then peeled off the die backside, releasing the adhered die. Subsequently, a robotic loading arm 19 picks the die and places it in the transport cavity.

Before placement of the die 16 in the transport cavity 17, however, the loading arm 19 must flip the die 16 over for proper positioning in the transport cavity 17. The transfer machine 15, thus, typically includes a flipper mechanism 26 that works in conjunction with the loading arm. In the past, the loading arm 19 picked the separated die 16 and placed it on a platform of the flipper mechanism 26, which then rotatably flipped the die over. Once flipped, as simplified in the following description, the platform would release the flipped die into the transport cavity for future chip processing. More recently, the loading arm places the separated die into a station of a multi-station rotary die handling device which significantly improved the flipping capacity. This design is the subject of U.S. Pat. No. 6,364,089 which is incorporated by reference in its entirety.

While these current device transfer machines adequately perform their respective functions, they are problematic for a number of reasons. For example, the needle push-up technique applied to remove the die adhered to the wafer saw tape is slow, tedious and complex. Depending upon the height and weight of the dice, certain parameters require proper adjustment such as pick and bond forces, height adjustment, etc. Due to such complex physical demands and restraints, a bulk removal approach of the dice from the wafer saw tape cannot be accommodated. This represents a significant bottleneck in the overall IC testing and packaging sequence.

In view of the foregoing, a device transfer machine with improved throughput would be desirable.

SUMMARY OF THE INVENTION

The present invention is directed to a post singulation, die separation assembly configured for bulk separation of a plurality of dice in a singulated wafer from the adhesive backing of wafer saw tape. The die separation assembly includes a support base defining a support surface having a first portion and an opposite second portion thereof. The second portion include a down-ramped portion skewed downwardly at a first acute angle from the support surface. The separation assembly further includes a feed tray having a collection end positioned adjacent the base second portion such that an elongated, substantially thin gap is formed between the tray collection end and at least a portion of the base second portion. A flexible platform is movably supported atop the base support surface for movement from the first portion to the second portion thereof. At the second portion, the platform passes downward through the gap formed between the tray collection end and the at least a portion of the base second portion. The platform further defines an upward facing surface upon which of the singulated wafer is adhered thereto, via the saw tape. The wafer is to be positioned such that each die is in a forward aligned manner. Upon movement of the flexible platform down the down-ramped portion of the support base, a portion of the wafer saw tape thereat is peeled away from the respective die. At this region, the portion of the tape is separated from the dice, releasing the respective dice onto the collection end of the feed tray in a manner substantially maintaining the forward alignment orientation thereof.

Accordingly, unlike current die transfer machine designs, the present invention enables bulk removal of multiple dice of the same singulated wafer from the adhesive wafer saw tape. At the same time, the forward alignment orientation of each separated die is maintained which enables bulk feeding to subsequently die handling devices that substantially increases manufacturing capacity.

In one specific embodiment, the base second portion further includes an up-ramp portion of the base skewed upwardly at a second acute angle from the support surface portion, oriented just before the down-ramp portion. The up-ramp portion and the down-ramp portion intersect an apex edge portion. It is at this edge portion where the saw tape is peeled away from the respective die during movement of the adhered wafer along the base. When no up-ramp portion is provided, the first acute angle of the down-ramp portion (from the support surface) is in the range of about 60° to about 90°. When an up-ramp portion is applied, as set forth above, the first acute angle is in the range of about 45° to about 60°, while the second acute angle (between the support surface and the down-ramp portion, is preferably in the range of about 15° to about 30°. This forms an intersection angle at the apex edge portion in the range of about 90° to about 120°.

In another embodiment, the collection end of the feed tray includes a collection surface disposed at an elevation proximate to that of the apex edge portion. Further, the thin gap formed between the tray collection end and the down-ramped portion is less than the height of the separated die. However, the gap height is also more than the combined thickness of the flexible platform and the adhered saw tape. This facilitates aligned transfer of the separated dice onto the collection end of the feed tray, while preventing lodging of the dice in the gap.

A top plate device is included in another embodiment that is positioned proximate to the base second portion, and vertically spaced-apart from the base support surface. During peeling of the saw tape from the dice as they pass over the apex edge portion, the top plate device substantially prevents flipping of the respective die by pushing down on the upper surface thereof, while at the same time maintaining the die's forward alignment orientation.

In still another specific embodiment, a driven roller assembly is included having a first roller and a second roller. The flexible platform is in the form of an elongated sheet material having one end wound around the first roller, and the opposite end wound around the second roller. Preferably, the elongated sheet material is provided by a one-sided tape material.

In yet another aspect of the present invention, a post singulation, bulk feed semiconductor assembly is adapted to separate the adhesive wafer saw tape from the plurality of dice of a singulated wafer, wherein the same is bulk feed in a substantially aligned manner. The assembly includes a semiconductor feed tray having a collection end and an opposite feed end. A collection surface of the feed tray extends from the collection end to the feed end. A die separation assembly includes a support base defining a support surface and having a first portion and an opposite second portion thereof. The second portion is positioned substantially adjacent the collection end of the feed tray such that the base support surface is positioned elevationally proximate the tray collection surface. This forms a thin elongated gap between the tray collection end and the base second portion. A movable platform is movably supported atop the base support surface for movement from the first portion to the second portion thereof. At the second portion, the platform is directed downward through the elongated gap formed between the tray collection end and the base second portion. The downward ramp is skewed at a first acute angle from the support surface. The platform defines an upward facing adherence surface upon which at least one of a plurality of singulated wafer is adhered thereto, via the saw tape. Each die is substantially maintained in a forward aligned manner, wherein upon movement of the platform through the thin elongated gap, a portion of the wafer saw tape thereat is peeled away from the respective die or dice. This separates and releases the respective die or dice onto the collection end of the feed tray in a manner substantially maintaining their respective forward alignment orientation. As the dice are transferred onto the feed tray, the subsequent dice urge the currently deposited dice toward the tray feed end and into contact with the respective dice previously released onto the collection surface. Finally, the bulk feed semiconductor assembly includes a die alignment assembly oriented at the feed end of the feed tray, and adapted to collective cooperate with the dice at the tray feed end for final alignment before removal from the feed tray.

In one specific configuration, the feed tray includes a plurality of separation walls upstanding from the collection surface and extending longitudinally from proximate the collection end to proximate the feed end of the feed tray. In another arrangement, a die timing and alignment assembly is included having a die alignment stopper extending across and transverse to the feed tray. The die alignment stopper is selectively movable between a first position, preventing passage of the dice at the feed end therethrough, and a second position, permitting passage of the dice therethrough.

In another embodiment, a semiconductor handling device is included that is positioned proximate the feed end of the feed tray. This handling device enables bulk feed of the aligned dice into discrete stations of the handling device for subsequent die placement thereof.

The die timing and alignment assembly further includes a die mounting stopper extending across the discrete stations of the handling device. This second die stop is selectively movable between a load position, enabling loading of the dice onto the handling device at the discrete station, and a transport position, permitting transport of the loaded dice on the handling device.

BRIEF DESCRIPTION OF THE DRAWINGS

The assembly of the present invention has other objects and features of advantage which will be more readily apparent from the following description of the Detailed Description of the Embodiments and the appended claims, when taken in conjunction with the accompanying drawings, in which:

FIG. 1 is a side elevation view of a prior art die transfer machine, including a die pick and place mechanism and a die flipping mechanism.

FIG. 2 is an enlarged side elevation view of a prior art die push-up system.

FIG. 3 is a top perspective view of a post-singulation die separation apparatus constructed in accordance with the present invention.

FIGS. 4A–4C is a sequence of enlarged, fragmentary, side elevation views, in cross-section, of the die separation apparatus of FIG. 3, and illustrating removal of the wafer saw tape from the singulated wafer and loading onto a die transfer mechanism.

DETAILED DESCRIPTION OF PREFERRED EMBODIMENTS

While the present invention will be described with reference to a few specific embodiments, the description is illustrative of the invention and is not to be construed as limiting the invention. Various modifications to the present invention can be made to the preferred embodiments by those skilled in the art without departing from the true spirit and scope of the invention as defined by the appended claims. It will be noted here that for a better understanding, like components are designated by like reference numerals throughout the various figures.

Attention is now directed to FIGS. 3 and 4, where a post singulation, die separation assembly, generally designated 30, is illustrated for bulk separation of a plurality of dice 16 of a post singulated wafer assembly 31 from the adhesive wafer saw tape 20. The die separation assembly 30 includes an elongated support base 32 having a support surface extending from a first portion 33, on one side of the base, to a second portion 35, on an opposite side thereof. As best viewed in FIG. 3, the base second portion 35 includes a down-ramped portion 36 thereof that is skewed downwardly at a first acute angle from the generally horizontal support surface 37. A feed tray, generally designated 38, includes a collection end 40 positioned adjacent the base second portion 35 such that an elongated, substantially thin gap 41 (FIGS. 4A–4C) is formed between the tray collection end 40 and at least a portion of the base second portion 35. A flexible platform, generally designated 42, is movably supported atop the base support surface for movement from the first portion 33 to the second portion 35 thereof.

FIG. 4A best illustrates that at the second portion 35 of the support base 32, the flexible platform 42 passes downward through the thin gap 41 formed between the tray collection end 40 and the at least a portion of the base second portion 35. In accordance with the present invention, by adhering the backside of the wafer saw tape 20 to the upward facing surface of the flexible platform 42 in an aligned manner, the saw tape will be peeled from the dice 16 proximate the location where the flexible platform passes through the gap.

Accordingly, upon movement of the flexible platform 42, with the adhered wafer saw tape 20 thereto, down the down-ramped portion 36 of the base second portion 35, a portion of the wafer saw tape 20 thereat is peeled away from the respective die or dice 16. As viewed in FIG. 3, the saw tape 20 is separated from the dice (nearly simultaneously depending upon which row), releasing the respective dice 16 onto the collection end 40 of the feed tray 38. In accordance with the present invention, once the saw tape 20 is peeled from the respective row of dice 16, they are delivered atop the collection end 40 of the feed tray 38 in a manner substantially maintaining the forward alignment orientation that each die held before separations. Briefly, it will be appreciated that a forward aligned orientation is defined essentially as any predetermined and desired alignment of the die.

In contrast to the transfer machine designs where the pick and place mechanisms only remove a single die at a time, the present invention enables bulk removal of the dice from the same singulated wafer. Consequently, as viewed in FIG. 3, the separated dice can also be bulk fed to a subsequent die handling device that can handle the increased capacity, thereby eliminating any intermediary "pick and place" device. Manufacturing capacity is thus significantly increased, as well as substantially simplifying the operations.

Referring back to FIGS. 4A–4C, it is shown that the support surface 37 of the support base 32 is preferably planar and horizontal. Further, in one specific configuration, the support base 32 is relatively rigid for support of the flexible platform 42 and mounted wafer assembly 31 thereatop. The base support surface 37 is also preferably substantially smooth and absent of any sharp edges or corners so as to promote unobstructed sliding of the bottom side of the flexible platform across the base from the first portion 33 to the second portion 35 thereof. Accordingly, as will be discussed, the base second portion 35 includes an apex edge portion 43 that is sufficiently angular to promote peeling of the saw tape 20 from the dice 16 as the flexible platform passes over, but at the same time edge portion must not be too sharp to impede passage of or cause severing of the flexible platform.

In other embodiments, however, the support surface 37 of the support base 32 can be semi-rigid. It will be appreciated, however, that the support surface should be sufficiently rigid such that peeling will be enabled at the respective portion of the saw tape when the respective dice pass over the apex edge portion 43. It will further be appreciated that other support structures may be incorporated to promote movement along the support surface 37, such as, for instance, rolling support through the addition of roller devices or the like.

In the preferred form, the flexible platform 42 is of a sufficient width to accommodate the entire singulated wafer and the wafer saw tape 20 upon which is mounted (i.e., the singulated wafer assembly 31). As best shown in FIG. 3, once the wafer ring (not shown) is removed, the perimeter of the saw tape often extends beyond the perimeter of the remaining singulated wafer. Prior to peeling of the wafer tape 20 from the sawn dice 16, the singulated wafer assembly 31 is placed upon the flexible platform 42 between the base first portion 33 and the base second portion 35. Such placement may be automated or performed manually, but must be positioned in a manner where the dice are in the designated forward alignment orientation.

To adhere the wafer saw tape 20 to the flexible platform 42, either the bottom surface of the saw tape or the support surface 37 of the flexible platform may include an adhesive to promote adherence therebetween. Most importantly, it is imperative that the outer perimeter portion of the saw tape 20 be adhered to the flexible platform, especially the initial or very front tape portion 46 of the outer perimeter portion, so that when the corresponding portion of the flexible platform 42 and the adhered saw tape 20 moves into the thin gap 41, that very front portion 46 of the saw tape is drawn therein rather than itself separating from the flexible platform. Should such initial separation of the saw tape occur from the flexible platform, the entire singulated wafer assembly 31 would then be delivered atop the collection end of the feed tray. To assure initial tape separation into the thin gap 41, in some instances, an additional adhesive tape 47 may be provided over the front tape portion 46 of the outer perimeter. As shown in FIG. 3, this effectively sandwiches the front tape portion 46 between the additional adhesive tape 47 and the flexible platform to promote the initial peeling at the apex edge portion 43.

Preferably, the flexible platform 42 will contain the applied adhesive to the upper surface thereof. In one specific embodiment, the flexible platform is provided by a roll form of one-sided adhesive tape. Moreover, as best shown in FIG. 3, to enable a continuous feed of the flexible platform 42 (e.g., the one-sided tape) across the support base 32, a roller assembly 48 is incorporated into the system. The roller assembly 48 includes front roller 50, positioned proximate the base first portion 33, and a rear roller 51, positioned proximate the base second portion 35. Working in tandem, the front roller 50 supplies the flexible platform 42 to the support base 32, while the rear roller 51 functions to collect and roll the utilized flexible platform and adhered saw tape 20 from atop the support base 32.

At least one of the rollers is conventionally driven to move the flexible platform from the first portion of the base to the second portion thereof. Movement of the flexible platform 42 across the support base can be selectable controlled, depending upon the desired rate of delivery of the dice to the feed tray. This speed, however, will be relatively slow, although depending upon the size of the dice, this speed may adjusted accordingly.

To assure continuous tension of the flexible platform 42 atop the support base 32, some form of tensioning device and/or tension sensors are utilized that work in conjunction with the rollers. Such tensioning device, cooperating with the tension sensors, can be automated to assure the proper degree of continuous tension across the support base. This is especially important across the apex edge portion 43 where tape peeling occurs. Such tensioning promotes proper peeling of the tape from the dice, as well as assures that the tape will not fold over the gap and onto the collection end 40 of the feed tray 38.

In accordance with the present invention and as mentioned above, peeling of the saw tape 20 from the singulated dice 16 occurs at the apex edge portion 43 between the support surface 37 of the base and the down-ramped portion 36 of the base second portion 35. Since the die or dice 16 are relatively rigid, and the saw tape is adhered to the flexible platform, as the wafer assembly passes over the apex edge portion 43 (FIG. 4A), the portion of the tape at this intersection is peeled back therefrom.

Accordingly, to promote tape peeling at the apex edge portion 43, the down-ramped portion 36 must be at an angle sufficiently acute from the base support surface 37 (e.g., a substantially horizontal surface). This angle has been determined to be at least in the range of about 60 deg to about 90 deg. Moreover, while the apex edge portion 43 need not be a distinct edge, the radius of curvature of this edge must not be so large that die merely rides over the apex edge portion without the front edge portion of the die lifting up and separating from the saw tape 20. Accordingly, in one configuration, depending upon the size of the die, the radius of curvature may be in the range of about 10 mil to about 20 mil. Otherwise, rather than ensuring that the front edge of the die will land atop the collection end 40 of the feed tray 38, it may initially commence movement down the gap 41 which would be problematic. Another requirement, as already indicated, is that the tension of the flexible platform 42 be maintained as it travels over the apex edge portion 43. Insufficient tension, particularly at this intersection will impede proper tape peeling.

Referring back to FIG. 3, in order to further promote peeling of the front edge portion 43 of the saw tape 20 from the die or dice 16, the base second portion 35 may further include an up-ramped portion 52 just upstream from the down-ramped portion 36 thereof. In this specific embodiment, it is this intersection between the up-ramped portion 52 and the down-ramped portion 36 that defines the apex edge portion 43. Accordingly, as the dice 16 are urged up this gradual up-ramped portion 52 by the moving flexible platform, once at the apex edge portion, the separated dice continue travel in the direction of the upward slope (FIG. 4A). The flexible platform 42 and adhered tape 20, however, commence travel through the thin gap 41 and down the down-ramp portion, peeling the tape from the die or dice 16. Upon further advancement, the front edge of the dice begin their descent, but over the collection end 40 of the feed tray 38 (FIG. 4B). Once the front edge of the dice contacts the upper surface of the collection end 40, the separated die/dice are delivered onto the feed tray.

In this configuration, the slope of the up-ramped portion 52 is at an upward acute angle, from the substantially planar support surface 37 of the support base, in the range of at least about 15° to about 30°. Further, the down-ramped portion 36, in this configuration, is at a downward acute angle from the base support surface 37, in the range of at least about 45° to about 60°. Collectively, the angular intersection between the up-ramp portion and the down-ramp portion, at the apex edge portion, is in the range of at least about 90° to about 120°. It is thus noted that this acute angle is similar to that of the embodiment where no up-ramp portion exists.

It will also be appreciated that the upper surface of the collection end 40, in this configuration, is disposed at an elevation substantially similar to that of the apex edge portion 43 of the support base 32. The similarities in elevation promotes landing the separated die/dice atop the collection end 40 during the separation cycle. It will be appreciated that the upper surface of the collection end 40 may be slightly above, and can be oriented slightly below the apex edge portion 43 by a greater margin than can be oriented above the collection end, without departing from the true spirit and nature of the present invention.

Another important aspect of the present invention is the dimension of the thin gap 41 formed between the collection end 40 and the base second portion 35 relative the height dimension of the dice. For example, the thickness or height dimension of the gap 41 must be sufficiently thin so that the separated dice will not themselves pass through or become snagged passing over the gap 41. Thus, the gap thickness is preferably at the very least less than the height of the dice being separated, and more preferably at least ½ the height of the dice. On the lower end, the gap thickness is just greater than the combined thickness of the flexible platform 42 and the adhered saw tape thereto. More preferably, however, the gap thickness is in between these dimensions to assure sufficient tolerance for thickness variations and the like.

To maintain the gap thickness through the down-ramp of the base second portion 35 accommodate the slope of the down-ramp portion, the collection end 40 of the feed tray is also tapered to define a portion of the gap 41.

In accordance with the present invention, a dice top plate device 53 is employed which substantially prevents flipping and/or substantially movement and rotation of the dice during separation from the saw tape at the apex edge portion 43. Moreover, this top plate device 53 further functions to maintain the forward alignment orientation of each die when it is delivered atop the collection end. This is especially important upon final separation of the respective die 16 from the saw tape 20, at the die rear corner thereof, which tends to lift the front end of the same upwardly. Upon contact with a bottomside of the top plate device 53, and with contact with the sides of adjacent dice, each die is maintained in their forward alignment orientation.

As best illustrated in FIG. 4A, the top plate device 53 includes an elongated body portion 55 that is disposed transversely over the second portion 35 of the support base 32. This is especially important at the region where the individual dice 16 are separated from the singulated wafer assembly 31 (i.e., above the apex edge portion 43). A distal edge of the top plate device 53, hence, preferably terminates proximate the apex edge portion 43 of the support base 32. It will be appreciated, however, that the distal edge may terminate or be vertically disposed much further downstream at locations above the collection end 40 of the feed tray 38 as well.

The elongated body portion 55 of the top plate device 53 extends substantially transversely across the entire width of the support base 32, and as mentioned functions to prevent flipping of the dice 16 as they are separated from the saw tape 20. Thus, the elongated body portion 55 is preferably substantially rigid (e.g., aluminum or stainless steel), and is cantilever mounted at an upstream end portion thereof. Thus, in some configurations, a downstream contacting portion 56 is permitted to slightly reciprocate up and down due to contact with the separated die 16. In other embodiments, the distance of contacting portion 56 of the substantially rigid plate from the apex edge portion does not vary significantly. It will be noted, however, that at no time should the bottom side of the top plate device 53 at the contacting end be spaced-apart any greater than about twice the height of the die 16.

As each row of dice (typically) is delivered atop the collection end 40 of the feed tray 38 during the die separation procedure, a respective frontside of each die will contact a backside of a respective die 16 in the corresponding column directly in front of it (FIG. 4C). This contact action during separation causes the corresponding column of dice to be urged forwardly longitudinally along the feed tray in the direction of arrow 57. This procedure is the primary means to move and urge the dice forward towards a feed end 58 of the feed tray 38 for subsequent handling of the separated dice.

In one specific embodiment, the columns of dice are maintained in their same respective columns as that of the singulated wafer. This approach, as shown in FIG. 3, is advantageous in that the length of the feed tray 38 can be minimized or reduced versus other designs where the number of columns along the feed tray 38 converge, as will be described. By reducing or minimizing the length along the feed tray, the less the pushing force that is required to push the separated dice from the collection end 40 to the feed end 58.

In this configuration, there may be provided a plurality of thin, longitudinally extending separation walls (not shown) positioned proximate the feed end that facilitate aligned separation of the dice atop the feed tray 38. These separation walls upstand from the upper surface of the feed tray, and are oriented substantially parallel one another.

One problem with this approach, however, is that there will be a much greater density of dice delivered to the middle columns of the feed tray 38 as opposed to that of the outside columns. As shown in FIG. 3, this is a consequence of the circular shape of the singulated wafers. This discrepancy, however, must be accounted for when the dice are feed to the subsequent die handling apparatus which will deliver significantly more dice at the center of the feed tray than at the outer portions thereof.

Accordingly, in another specific embodiment, the feed tray 38 may taper gradually inwardly from the collection end 40 to the feed end 58. The number of delivery columns that are ultimately bulk fed to the subsequent die handling device from the feed tray are thereby reduced. For example, a two-hundred column wafer can be narrowed or paired down to about twelve columns of dice at the feed end 58 of the feed tray 38.

Such gradual taper may be performed using the outer upstanding walls 60 of the feed tray which would gradually taper inwardly, although not illustrated in FIG. 3. As the inwardly taped walls 60 converge, the dice 16 also converge. In order to institute this design, it may be necessary to lengthen the feed tray 38 to assure a gradual taper. Too much taper in too short a span may cause excessive interference between the dice as they converge towards the feed end 58. Rather, this taper must be sufficient to minimize the length the feed tray, while being sufficiently gradual to eliminate clogging of the dice as they converge.

Moreover, as the dice are urged along the feed tray in the direction of arrow 57 by the delivery of the separating dice, the dice must maintain their forward alignment orientation while converging at the same time. Any rotation thereof caused by position jostling during convergence will defeat the purpose of the aligned delivery to the collection end. The advantage of this approach is that it significantly reduces the quantity discrepancy of the dice in the middle columns versus that of the outer columns.

To facilitate die movement along collection tray from the collection end 40 to the feed end 58 of the tray 38, in either the collection tray approach, a high frequency vibration may be induced upon the collection tray. Applying such high frequency vibration techniques, the lightweight singulated dice are caused to simultaneously vibrate. Accordingly, smaller forces can be applied to the columns of dice to induce movement along the tray. Moreover, in the tapered collection tray approach, the high frequency vibration unobstructed die merging of the converging columns of dice while substantially maintaining the forward alignment orientation thereof.

To further accommodate alignment of the dice 16 along the feed tray 38 before delivery for subsequent die handling devices, an alignment stopper, generally designated 61, may be incorporated. As best viewed in FIG. 4A, the alignment stopper 61 includes a rigid or semi-flexible flap portion 62 extending vertically downward toward the upper surface of the feed tray 38. This flap portion 62 is preferably semi-flexible or substantially rigid in form.

The flap portion 62, which also extends transversely across the entire feed tray 38, similar to the dice top plate device 53, is adapted for reciprocating movement between an alignment position (FIG. 4A) and a passage position (FIG. 4B). In the alignment position, the distal tip of the flap portion 62 is moved into contact, or near contact, with the upper surface of the feed tray 38 at the feed end 58 thereof. Since this flap portion 62 extends substantially perpendicular to the direction of travel of the dice 16 (i.e., in the direction of arrow 57) at the feed end 58, in the alignment position (FIG. 4A), the flap portion 62 will be placed in the directly path of the dice. Upon abutting contact with the flap portion, the entire row of dice will be simultaneously stopped, and align for subsequent die handling.

In the passage position (FIG. 4B), conversely, the flap portion 62 is moved upwardly and out of the path of the dice, permitting passage thereunder. Such movement between the alignment position and the passage position will be in a timed manner to cooperate with other componentry of the die separation assembly 30. These include the delivery of the separated dice 16 onto the collection end 40 of the feed tray 38, and the delivery of the entire row of aligned dice to the subsequently die handling devices 63, such as that illustrated in FIG. 3.

Accordingly, in another aspect of the present invention, an altered die handling device 63 is provided that is similar to that described in the above-mentioned U.S. Pat. No. 6,364,089. As shown in FIGS. 3–4C, this die flipper mechanism 63 includes an elongated, cylindrical-shaped die flipping wheel 65 rotating about axis 66. The wheel includes a plurality of rows 67 of die loading stations 68 radially spaced-apart about the perimeter of the wheel at about 45° increments. Each row 67 includes a plurality of die loading stations 68, the number and lateral spacing of which correspond to the number of columns of dice 16 at the feed end 40 of the feed tray 38. Thus, when the wheel 65 is positioned in a loading position (FIG. 4A), an entire row of dice 16 at the collection tray feed end 40 may be simultaneously loaded into the corresponding loading stations 68 of the wheel. It also follows that an entire row of dice may be disposed into the transport cavities 17 of the tape and reel assembly 18 at the bottom end thereof.

To facilitate loading of the dice 16 into the loading stations 68 of the wheel 65, the present invention may include a die loading stopper 70, just downstream from the alignment stopper 61. As best viewed in FIG. 4A, this loading stopper 70 functions to align die or dice 16 at the respective loading stations 68 on the subsequent die handling device 63 for loading thereon. Similar to the alignment stopper 61, the loading stopper 70 includes a rigid or semi-flexible flap portion 71 extending vertically downward. This flap portion is adapted for reciprocating movement between a mounting position (FIG. 4A) and a retracting position (FIG. 4C). In the mounting position, the distal tip of the flap portion 71 is moved into contact, or near contact, with an upper surface of the flipping wheel 65. As the row of dice are urged in the direction of arrow 57, contact with the flap portion 71 aligns the dice for aligned seating at the respective loading stations 68.

In the retracting position (FIG. 4C), conversely, the flap portion 71 is retracted or moved upwardly and out of the path of the dice. This permit passage of the mounted dice toward the delivery station into the transport cavities 17.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A post singulation, die separation assembly configured for separating adhesive wafer saw tape from the plurality of dice of a singulated wafer, said assembly comprising:
    a support base defining a support surface and having a first portion and an opposite second portion thereof, said second portion including a down-ramped portion thereof skewed downwardly at a first acute angle from the support surface;
    a feed tray having a collection end positioned adjacent the base second portion such that an elongated, substantially thin gap is formed between the tray collection end and at least a portion of the base second portion; and
    a flexible platform movably supported atop the base support surface for movement from said first portion to said second portion thereof, and downward through the gap formed between the tray collection end and the at least a portion of the base second portion, said platform defining an upward facing surface upon which the singulated wafer is adhered thereto, via the saw tape, each die being in a forward aligned manner;
    wherein, upon movement of said flexible platform down said down-ramped portion, a portion of the wafer saw tape thereat is peeled away from the respective die, separating and releasing the respective die onto the collection end of the feed tray in a manner substantially maintaining the forward alignment orientation of each die.

2. The separation assembly as recited in claim 1, wherein said first acute angle is in the range of about 60° to about 90°.

3. The separation assembly as recited in claim 2, wherein the base second portion includes an up-ramp portion of the base skewed upwardly at a second acute angle from the support surface portion, said up-ramp portion and said down-ramp portion intersecting an apex edge portion where said saw tape is peeled away from the respective die during movement of the adhered wafer thereto.

4. The separation assembly as recited in claim 3, wherein said first acute angle is in the range of about 45° to about 60° and said second acute angle is in the range of about 15° to about 30° and, forming an intersection angle of said apex edge portion in the range of about 90° to about 120°.

5. The separation assembly as recited in claim 4, wherein said collection end of the feed tray includes a collection surface disposed at an elevation proximate that of the apex edge portion.

6. The separation assembly as recited in claim 1, wherein the thin gap formed between the tray collection end and the down-ramped portion is less than the height of the separated die and more than the combined thickness of the flexible platform and the adhered saw tape.

7. The separation assembly as recited in claim 1, further including:
    a top plate device positioned proximate to said base second portion, and spaced-apart from the base support surface by a distance sufficient to substantially prevent flipping of the respective die during separation from the saw tape, while maintaining said forward alignment orientation of the die.

8. The separation assembly as recited in claim 7, wherein the spaced-apart distance between a bottom surface of said top plate device and the base support surface is at least less than two times the height of the die.

9. The separation assembly as recited in claim 1, further including:
    a driven roller assembly having a first roller and a second roller wherein said flexible platform is in the form of an elongated sheet material having one end wound around the first roller, and the opposite end wound around the second roller for said selective movement of the flexible platform from the first portion to the second portion of the base member.

10. The separation assembly as recited in claim 9, wherein said elongated sheet material is provided by a one-sided tape material.

11. The separation assembly as recited in claim 1, wherein said flexible platform is provided by a one-sided tape material.

12. A post singulation, bulk feed semiconductor assembly adapted to separate adhesive wafer saw tape from the plurality of dice of a singulated wafer, and bulk feeding the same in a substantially aligned manner, said assembly comprising:
    a semiconductor feed tray having a collection end and an opposite feed end, and a collection surface extending from the collection end to the feed end;
    a die separation assembly including:
        a support base defining a support surface and having a first portion and an opposite second portion thereof, said second portion being positioned substantially adjacent the collection end of the feed tray such that the base support surface is positioned elevationally proximate the tray collection surface, and such that a thin elongated gap is formed between the tray collection end and the base second portion; and
        a movable platform movably supported atop the base support surface for movement from said first portion to said second portion thereof, and downward through the elongated gap formed between the tray collection end and the base second portion at a first acute angle skewed from the support surface, said platform defining an upward facing adherence surface upon which at least one of a plurality of singulated wafer is adhered thereto, via the saw tape, each die being in a forward aligned manner, wherein upon movement of said platform through said thin elongated gap, a portion of said wafer saw tape thereat is peeled away from the respective die or dice, separating and releasing the respective die or dice onto the collection end of the feed tray in a manner substantially maintaining their respective forward alignment where the dice are urged toward the tray feed end and into contact with the respective dice previously released onto the collection surface; and a die alignment assembly oriented at the feed end of the feed tray, and adapted to collective cooperate with the dice at the tray feed end for final alignment before removal from the feed tray.

13. The assembly as recited in claim 12, wherein said die alignment assembly includes a first die stop extending across and transverse to said feed tray, said die stop being selectively movable between a first position, preventing passage of the dice at the feed end therethrough, and a second position, permitting passage of the dice therethrough.

14. The assembly as recited in claim 13, further including:

a semiconductor handling device positioned proximate the feed end of the feed tray for bulk feed of the aligned dice into discrete stations of the handling device subsequent die placement thereof.

15. The assembly as recited in claim 14, further including:

said die alignment assembly includes a second die stop extending across the discrete stations of the handling device, said second die stop being selectively movable between a load position, enabling loading of the dice onto the handling device at the discrete station, and a transport position, permitting transport of the loaded dice on the handling device.

16. The assembly as recited in claim 12, wherein said second portion includes a down-ramped portion thereof skewed downwardly at said first acute angle from the support surface.

17. The assembly as recited in claim 16, wherein the base second portion further includes an up-ramp portion of the base skewed upwardly at a second acute angle from the support surface portion, said up-ramp portion and said down-ramp portion intersecting an apex edge portion where said saw tape is peeled away from the respective die during movement of the adhered wafer thereto.

18. The assembly as recited in claim 12, wherein the thin gap formed between the tray collection end and the down-ramped portion is less than the height of the separated die and more than the combined thickness of the movable platform and the adhered saw tape.

19. The assembly as recited in claim 12, further including:

a top plate device positioned proximate to said base second portion, and spaced-apart from the base support surface by a distance sufficient to substantially prevent flipping of the respective die during separation from the saw tape, while maintaining.

20. The assembly as recited in claim 12, further including:

a driven roller assembly having a first roller and a second roller wherein said movable platform is in the form of an elongated sheet material of one-sided adhesive tape material having one end wound around the first roller, and the opposite end wound around the second roller for said selective movement of the movable platform from the first portion to the second portion of the base member.

* * * * *